United States Patent
Watanabe et al.

(10) Patent No.: US 12,061,247 B2
(45) Date of Patent: Aug. 13, 2024

(54) MAGNETIC SENSOR

(71) Applicant: TDK CORPORATION, Tokyo (JP)

(72) Inventors: Kazuya Watanabe, Tokyo (JP); Kenzo Makino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 143 days.

(21) Appl. No.: 17/947,243

(22) Filed: Sep. 19, 2022

(65) Prior Publication Data

US 2023/0089851 A1 Mar. 23, 2023

Related U.S. Application Data

(60) Provisional application No. 63/246,428, filed on Sep. 21, 2021.

(30) Foreign Application Priority Data

Sep. 1, 2022 (JP) ................. 2022-139452

(51) Int. Cl.
 G01R 33/09 (2006.01)
 G01R 33/00 (2006.01)
(52) U.S. Cl.
 CPC ....... G01R 33/093 (2013.01); G01R 33/0005 (2013.01)
(58) Field of Classification Search
 CPC ..................... G01R 33/093; G01R 33/091
 See application file for complete search history.

(56) References Cited

U.S. PATENT DOCUMENTS

| | | | |
|---|---|---|---|
| 4,028,685 A * | 6/1977 | Eggenberger | G11C 19/0816 365/3 |
| 5,952,825 A | 9/1999 | Wan | |
| 2006/0176142 A1 | 8/2006 | Naito et al. | |
| 2007/0025028 A1 | 2/2007 | Chung et al. | |
| 2007/0097732 A1 | 5/2007 | Chung et al. | |
| 2008/0316654 A1 | 12/2008 | Aiso | |
| 2009/0015251 A1 | 1/2009 | Azumi et al. | |
| 2019/0293732 A1 | 9/2019 | Makino | |
| 2021/0302511 A1 | 9/2021 | Makino et al. | |

FOREIGN PATENT DOCUMENTS

JP 2005-340715 A 12/2005

* cited by examiner

*Primary Examiner* — Alesa Allgood
(74) *Attorney, Agent, or Firm* — Oliff PLC

(57) ABSTRACT

A magnetic sensor includes a substrate including a top surface, an insulating layer including an inclined surface, and a magnetic detection element disposed on the inclined surface. The magnetic detection element includes a first side surface and a second side surface. The first side surface is located at a position forward in a first direction that is one direction along the inclined surface. The second side surface is located at a position forward in a second direction that is another direction along the inclined surface. The magnetic detection element includes a first non-constant portion in which a gap between an upper end of the first side surface and an upper end of the second side surface becomes smaller along the longitudinal direction of the magnetic detection element.

19 Claims, 10 Drawing Sheets

MAGNETIC SENSOR

CROSS REFERENCE TO RELATED APPLICATIONS

This application claims the benefit of U.S. Provisional Patent Application No. 63/246,428 filed on Sep. 21, 2021 and Japanese Priority Patent Application No. 2022-139452 filed on Sep. 1, 2022, the entire contents of each of which are incorporated herein by their reference.

BACKGROUND

The technology relates to a magnetic sensor including magnetic detection elements each disposed on an inclined surface.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

As the magnetoresistive elements, spin-valve magnetoresistive elements are used, for example. The spin-valve magnetoresistive element includes a magnetization pinned layer having a magnetization whose direction is fixed, a free layer having a magnetization whose direction is variable depending on the direction of an applied magnetic field, and a gap layer disposed between the magnetization pinned layer and the free layer. For the free layer, a technique of setting/resetting the magnetization direction of the free layer using a coil is known.

U.S. Patent Application Publication No. 2006/0176142 A1 discloses a magnetic sensor including magnetoresistive elements each formed on an inclined surface. U.S. Pat. No. 5,952,825 A discloses a technique of setting/resetting magnetic domains in magnetoresistive elements using coils.

In a case where magnetoresistive elements are each formed on an inclined surface like the magnetic sensor disclosed in U.S. Patent Application Publication No. 2006/0176142 A1 and the magnetization direction of a free layer is set to a predetermined direction using the technique disclosed in U.S. Pat. No. 5,952,825 A, it has been necessary to increase, to some extent, the strength of a magnetic field for setting the magnetization direction of the free layer to a predetermined direction depending on the shape of each magnetoresistive element.

SUMMARY

A magnetic sensor according to one embodiment of the technology includes a substrate including a reference plane; a support member disposed on the substrate, the support member including an inclined surface inclined with respect to the reference plane; and a magnetic detection element disposed on the inclined surface, the magnetic detection element having a long shape in one direction. The magnetic detection element includes a first side surface and a second side surface located on both sides in a short-side direction of the magnetic detection element, each of the first side surface and the second side surface including an upper end located at an end in a direction away from the reference plane. The first side surface is located at a position forward in a first direction, the first direction being a direction along the inclined surface and also being a direction away from the reference plane. The second side surface is located at a position forward in a second direction, the second direction being a direction along the inclined surface and also being a direction closer to the reference plane. The magnetic detection element includes a first non-constant portion in which at least a part of each of the upper end of the first side surface and the upper end of the second side surface is linear, and a gap between the upper end of the first side surface and the upper end of the second side surface becomes smaller along a longitudinal direction of the magnetic detection element.

In the magnetic sensor according to one embodiment of the technology, the magnetic detection element includes the first non-constant portion. Thereby according to one embodiment of the technology, it is possible to, in a magnetic sensor including magnetic detection elements each disposed on an inclined surface, reduce the strength of a magnetic field for setting/resetting magnetization of each magnetic detection element.

Other and further objects, features, and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
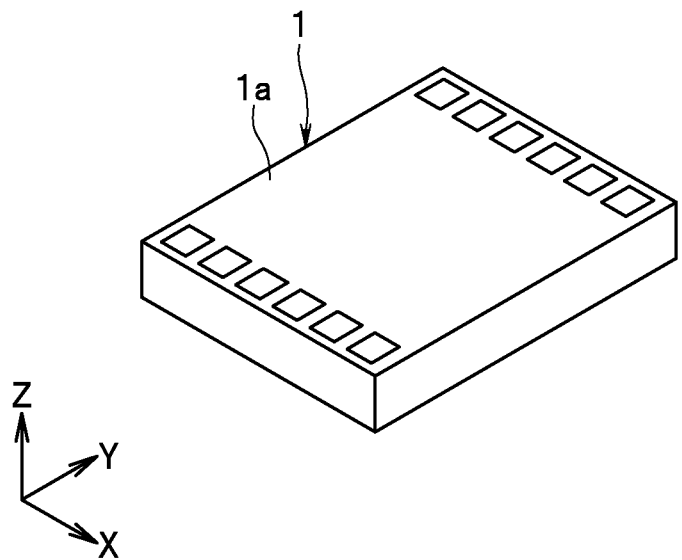
FIG. 1 is a perspective view showing a magnetic sensor according to a first example embodiment of the technology.

An object of the technology is to provide a magnetic sensor that includes magnetic detection elements each disposed on an inclined surface and in which the strength of a magnetic field for setting/resetting magnetization of each magnetic detection element can be reduced.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
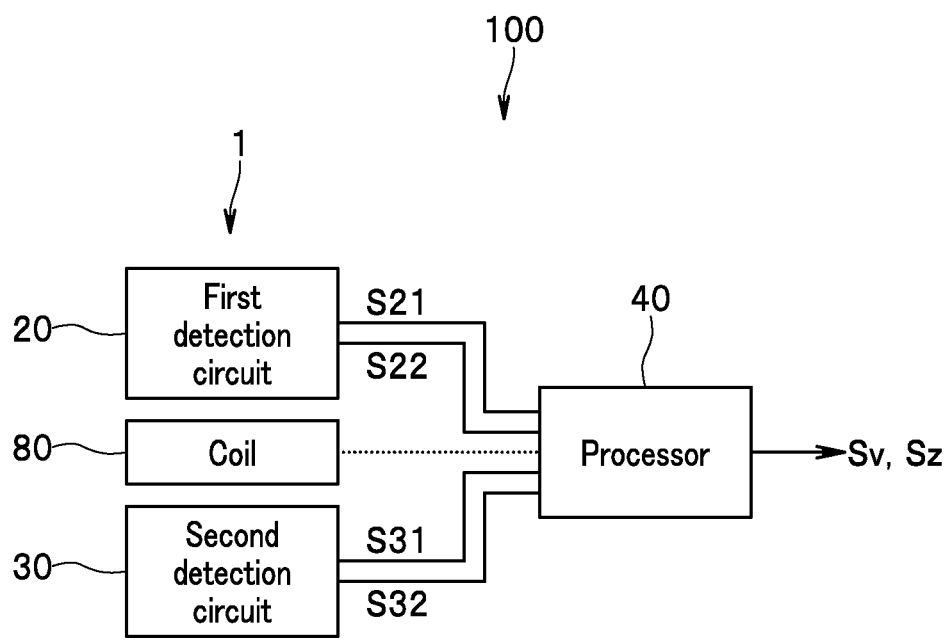
FIG. 2 is a functional block diagram showing a configuration of a magnetic sensor device including the magnetic sensor according to the first example embodiment of the technology.

First, a configuration of a magnetic sensor according to a first example embodiment of the technology will be described with reference to FIGS. 1 and 2. FIG. 1 is a perspective view showing a magnetic sensor according to the example embodiment. FIG. 2 is a functional block diagram showing a configuration of a magnetic sensor device including the magnetic sensor according to the example embodiment.

As shown in FIG. 1, the magnetic sensor 1 is in the form of a chip having a rectangular parallelepiped shape. The magnetic sensor 1 includes a top surface 1*a* and a bottom surface located opposite to each other and also includes four side surfaces connecting the top surface 1*a* to the bottom surface. The magnetic sensor 1 also includes a plurality of electrode pads disposed on the top surface 1*a*.

Now, a description will be given of a reference coordinate system in the present example embodiment with reference to FIG. 1. The reference coordinate system is an orthogonal coordinate system that is set with reference to a magnetic sensor 1 and defined by three axes. An X direction, a Y direction, and a Z direction are defined in the reference coordinate system. The X, Y, and Z directions are orthogonal to each other. In particular, in the example embodiment, a direction that is perpendicular to the top surface 1*a* of the magnetic sensor 1 and is oriented from the bottom surface to the top surface 1*a* of the magnetic sensor 1 is defined as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor 1, the term "top surface" refers to a surface of the component located at the end thereof in the Z direction, and "bottom surface" refers to a surface of the component located at the end thereof in the −Z direction. The phrase "when seen in the Z direction" means that an object is seen from a position at a distance in the Z direction.

As shown in FIG. 2, the magnetic sensor 1 includes a first detection circuit 20 and a second detection circuit 30. Each of the first and second detection circuits 20 and 30 includes a plurality of magnetic detection elements, and is configured to detect a target magnetic field to generate at least one detection signal. In particular, in the example embodiment, the plurality of magnetic detection elements are a plurality of magnetoresistive elements. The magnetoresistive elements will hereinafter be referred to as MR elements.

A plurality of detection signals generated by the first and second detection circuits 20 and 30 are processed by a processor 40. The magnetic sensor 1 and the processor 40 constitute a magnetic sensor device 100. The processor 40 is configured to, by processing the plurality of detection signals generated by the first and second detection circuits 20 and 30, generate a first detection value and a second detection value respectively having correspondences with components of a magnetic field in two different directions at a predetermined reference position. In particular, in the present example embodiment, the foregoing two different directions are a direction parallel to an XY plane and a direction parallel to the Z direction. For example, the processor 40 is constructed of an application-specific integrated circuit (ASIC).

The processor 40 may be included in a support supporting the magnetic sensor 1, for example. The support includes a plurality of electrode pads. The first and second detection circuits 20 and 30 are connected to the processor 40 via the plurality of electrode pads of the magnetic sensor 1, the plurality of electrode pads of the support, and a plurality of bonding wires, for example. In a case where the plurality of electrode pads of the magnetic sensor 1 are provided on the top surface 1*a* of the magnetic sensor 1, the magnetic sensor 1 may be mounted on the top surface of the support in such a posture that the bottom surface of the magnetic sensor 1 faces the top surface of the support.

Figure 3:
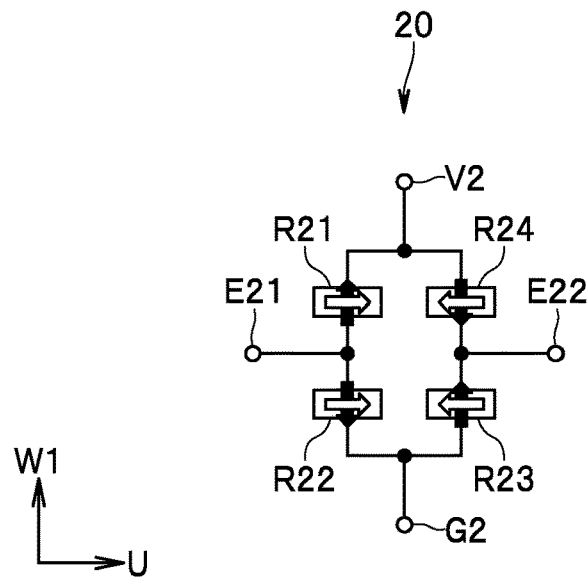
FIG. 3 is a circuit diagram showing a circuit configuration of a first detection circuit of the first example embodiment of the technology.
Figure 4:
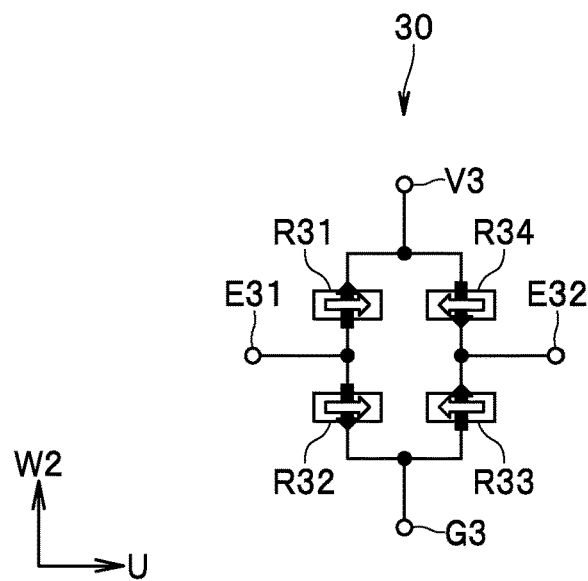
FIG. 4 is a circuit diagram showing a circuit configuration of a second detection circuit of the first example embodiment of the technology.
Figure 5:
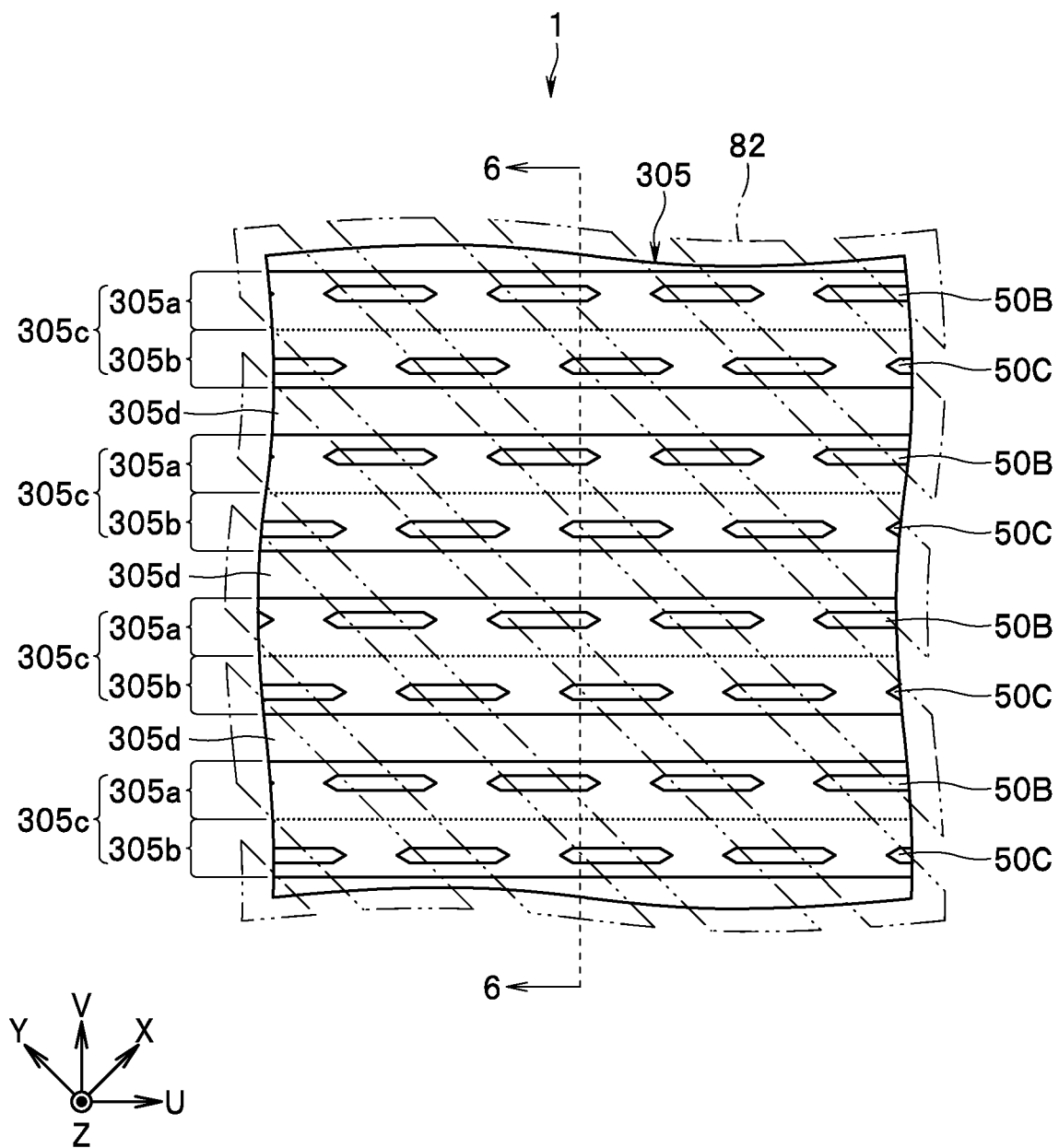
FIG. 5 is a plan view showing a part of the magnetic sensor according to the first example embodiment of the technology.
Figure 6:
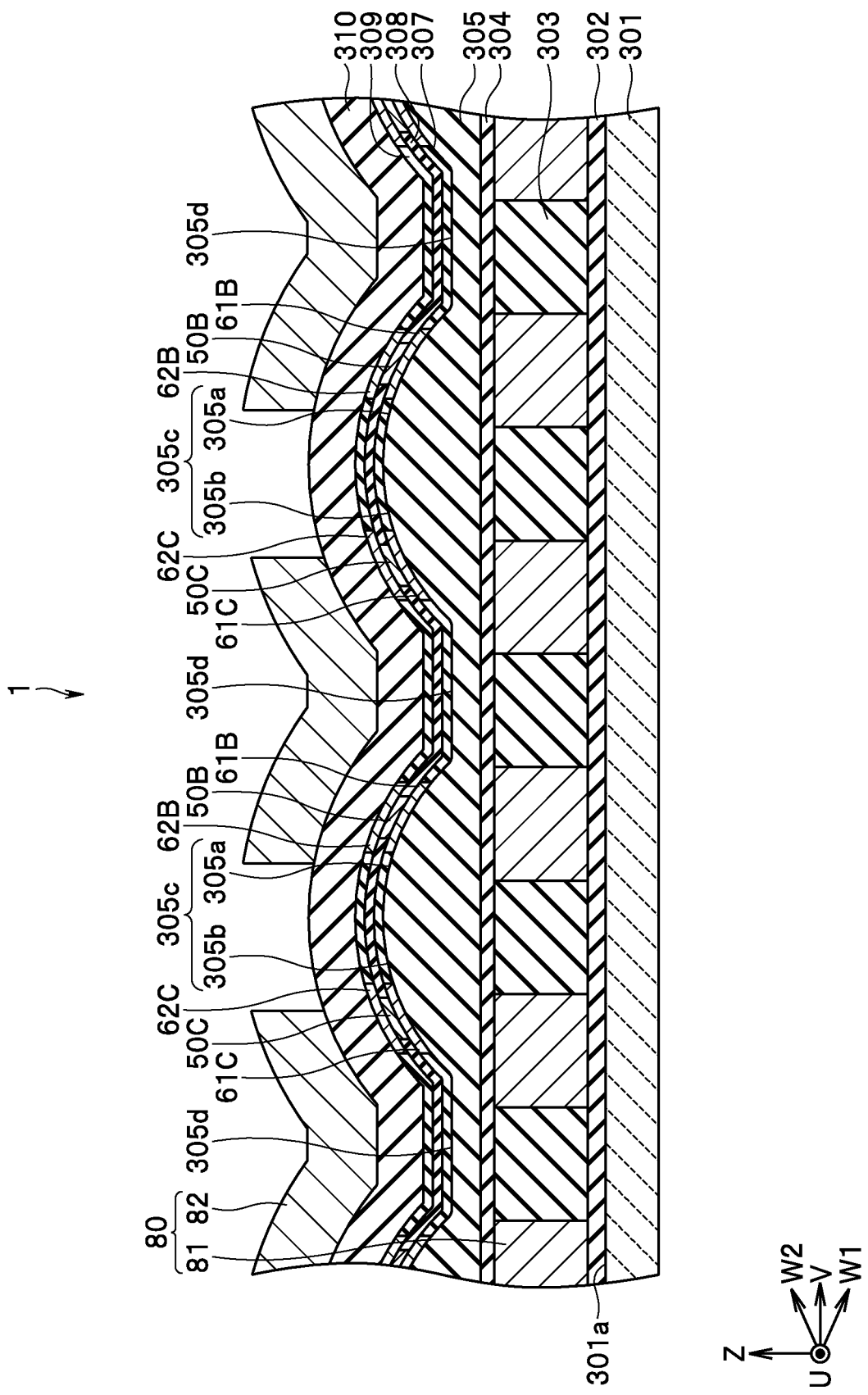
FIG. 6 is a sectional view showing a part of the magnetic sensor according to the first example embodiment of the technology.

Next, the first and second detection circuits 20 and 30 will be described with reference to FIGS. 3 to 6. FIG. 3 is a circuit diagram showing a circuit configuration of the first detection circuit 20. FIG. 4 is a circuit diagram showing a circuit configuration of the second detection circuit 30. FIG. 5 is a plan view showing a part of the magnetic sensor 1. FIG. 6 is a sectional view showing a part of the magnetic sensor 1.

Here, as shown in FIG. 5, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by α, and the V direction is set to a direction rotated from the Y direction to the X direction by α. Note that α is an angle greater than 0° and smaller than 90°. For example, α is 45°. −U direction refers to a direction opposite to the U direction, and −V direction refers to a direction opposite to the V direction.

As shown in FIG. 6, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by β, and the W2 direction is set to a direction rotated from the V direction to the Z direction by β. Note that β is an angle greater than 0° and smaller than 90°. −W1 direction refers to a direction opposite to the W1 direction, and −W2 direction refers to a direction opposite to the W2 direction. The W1 direction and W2 direction both are orthogonal to the U direction.

The first detection circuit 20 is configured to detect a component of the target magnetic field in a direction parallel to the W1 direction and generate at least one first detection signal which has a correspondence with the component. The second detection circuit 30 is configured to detect a component of the target magnetic field in a direction parallel to the W2 direction and generate at least one second detection signal which has a correspondence with the component.

As shown in FIG. 3, the first detection circuit 20 includes a power supply port V2, a ground port G2, signal output ports E21 and E22, a first resistor section R21, a second resistor section R22, a third resistor section R23, and a fourth resistor section R24. The plurality of MR elements of the first detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 4, the second detection circuit 30 includes a power supply port V3, a ground port G3, signal output ports E31 and E32, a first resistor section R31, a second resistor section R32, a third resistor section R33, and a fourth resistor section R34. The plurality of MR elements of the second detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of a predetermined magnitude is applied to each of the power supply ports V2 and V3. Each of the ground ports G2 and G3 is connected to the ground.

The plurality of MR elements of the first detection circuit 20 will be referred to as a plurality of first MR elements 50B. The plurality of MR elements of the second detection circuit 30 will be referred to as a plurality of second MR elements 50C. Since the first and second detection circuits 20 and 30 are the components of the magnetic sensor 1, it can be said that the magnetic sensor 1 includes the plurality of first MR elements 50B and the plurality of second MR elements 50C. Any given MR element will be denoted by the reference numeral 50.

Figure 7:
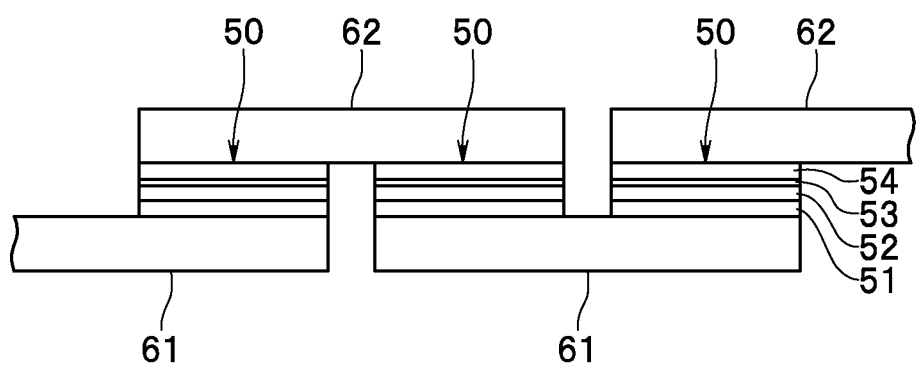
FIG. 7 is a side view showing a magnetoresistive element of the first example embodiment of the technology.

FIG. 7 is a side view showing the MR element 50. The MR element 50 is a spin-valve MR element including a plurality of magnetic layers. The MR element 50 includes a magnetization pinned layer 52 having a magnetization whose direction is fixed, a free layer 54 having a magnetization whose direction is variable depending on the direction of a target magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used. The magnetization pinned layer 52, the gap layer 53, and the free layer 54 are stacked in this order.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 7.

In FIGS. 3 and 4, solid arrows represent the magnetization directions of the magnetization pinned layers 52 of the MR elements 50. Hollow arrows represent the magnetization directions of the free layers 54 of the MR elements 50 in a case where no target magnetic field is applied to the MR elements 50.

In the example shown in FIG. 3, the magnetization directions of the magnetization pinned layers 52 in each of the first and third resistor sections R21 and R23 are the W1 direction. The magnetization directions of the magnetization pinned layers 52 in each of the second and fourth resistor sections R22 and R24 are the −W1 direction. The free layer 54 in each of the plurality of first MR elements 50B has a shape anisotropy that sets the direction of the magnetization easy axis to a direction parallel to the U direction. The magnetization directions of the free layers 54 in each of the first and second resistor sections R21 and R22 in a case where no target magnetic field is applied to the first MR elements 50B are the U direction. The magnetization directions of the free layers 54 in each of the third and fourth resistor sections R23 and R24 in the foregoing case are the −U direction.

In the example shown in FIG. 4, the magnetization directions of the magnetization pinned layers 52 in each of the first and third resistor sections R31 and R33 are the W2 direction. The magnetization directions of the magnetization pinned layers 52 in each of the second and fourth resistor sections R32 and R34 are the −W2 direction. The free layer 54 in each of the plurality of second MR elements 50C has a shape anisotropy that sets the direction of the magnetization easy axis to a direction parallel to the U direction. The magnetization directions of the free layers 54 in each of the first and second resistor sections R31 and R32 in a case where no target magnetic field is applied to the second MR elements 50C are the U direction. The magnetization directions of the free layers 54 in each of the third and fourth resistor sections R33 and R34 in the foregoing case are the −U direction.

The magnetic sensor 1 includes a magnetic field generator configured to apply a magnetic field in a predetermined direction to the free layer 54 of each of the plurality of first MR elements 50B, and the plurality of second MR elements 50C. In the present example embodiment, the magnetic field generator includes a coil 80 that applies a magnetic field in the predetermined direction to the free layer 54 in each of the plurality of first MR elements 50B and the plurality of second MR elements 50C.

Note that the magnetization directions of the magnetization pinned layers 52 and the directions of the magnetization easy axes of the free layers 54 may slightly deviate from the foregoing directions from the perspective of the accuracy of the manufacturing of the MR elements 50 and the like. The magnetization pinned layers 52 may be magnetized to include magnetization components in the foregoing directions as their main components. In such a case, the magnetization directions of the magnetization pinned layers 52 are the same or substantially the same as the foregoing directions.

In the present example embodiment, the MR element 50 is configured such that a current flows in the stacking direction of the plurality of magnetic layers, that is, the magnetization pinned layer 52 and the free layer 54. As described below, the magnetic sensor 1 includes a lower electrode and an upper electrode for flowing a current through the MR element 50. The MR element 50 is disposed between the lower electrode and the upper electrode.

Hereinafter, a specific structure of the magnetic sensor 1 will be described in detail with reference to FIGS. 5 and 6. FIG. 6 shows a part of a cross section at a position indicated by the line 6-6 in FIG. 5.

The magnetic sensor 1 includes a substrate 301 with a top surface 301a, insulating layers 302, 303, 304, 305, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. It is assumed that the top surface 301a of the substrate 301 is parallel to the XY plane. The Z direction is also a direction perpendicular to the top surface 301a of the substrate 301. The coil elements are a part of the coil winding.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304, and 305 are stacked in this order on the plurality of lower coil elements 81 and the insulating layer 303.

The plurality of lower electrodes 61B and the plurality of lower electrodes 61C are disposed on the insulating layer 305. The insulating layer 307 is disposed around the plurality of lower electrodes 61B and the plurality of lower electrodes 61C on the insulating layer 305. The plurality of first MR elements 50B are disposed on the plurality of lower electrodes 61B. The plurality of second MR elements 50C are disposed on the plurality of lower electrodes 61C. The insulating layer 308 is disposed around the plurality of first MR elements 50B and the plurality of second MR elements 50C on the plurality of lower electrodes 61B, the plurality of lower electrodes 61C, and the insulating layer 307. The plurality of upper electrodes 62B are disposed on the plurality of first MR elements 50B and the insulating layer 308. The plurality of upper electrodes 62C are disposed on the plurality of second MR elements 50C and the insulating layer 308. The insulating layer 309 is disposed around the plurality of upper electrodes 62B and the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310. The magnetic sensor 1 may further include a not-shown insulating layer that covers the plurality of upper coil elements 82 and the insulating layer 310.

The magnetic sensor 1 includes a support member supporting the plurality of first MR elements 50B and the plurality of second MR elements 50C. The support member includes at least one inclined surface inclined with respect to the top surface 301a of the substrate 301. In particular, in the example embodiment, the support member includes the insulating layer 305. Note that FIG. 5 shows the insulating layer 305, the plurality of first MR elements 50B, the plurality of second MR elements 50C, and the plurality of upper coil elements 82 among the components of the magnetic sensor 1.

The insulating layer 305 includes a plurality of protruding surfaces 305c each protruding in a direction (the Z direction) away from the top surface 301a of the substrate 301. Each of the plurality of protruding surfaces 305c extends in a direction parallel to the U direction. The overall shape of each of the protruding surfaces 305c is a semi-cylindrical curved surface formed by moving the curved shape (arch shape) of the protruding surface 305c shown in FIG. 6 along the direction parallel to the U direction. The plurality of protruding surfaces 305c are arranged at predetermined intervals along a direction parallel to the V direction.

Each of the plurality of protruding surfaces 305c includes an upper end portion farthest from the top surface 301a of the substrate 301. In the example embodiment, each of the upper end portions of the plurality of protruding surfaces 305c extends in the direction parallel to the U direction. Herein, focus is placed on a given protruding surface 305c of the plurality of protruding surfaces 305c. The protruding surface 305c includes a first inclined surface 305a and a second inclined surface 305b. The first inclined surface 305a refers to the part of the protruding surface 305c on the side of the V direction of the upper end portion of the protruding surface 305c. The second inclined surface 305b refers to the part of the protruding surface 305c on the side of the −V direction of the upper end portion of the protruding surface 305c. In FIG. 5, a boundary between the first inclined surface 305a and the second inclined surface 305b is indicated by a dotted line.

The upper end portion of the protruding surface 305c may be the boundary between the first inclined surface 305a and the second inclined surface 305b. In such a case, the dotted line shown in FIG. 5 indicates the upper end portion of the protruding surface 305c.

The top surface 301a of the substrate 301 is parallel to the XY plane. Each of the first inclined surface 305a and the second inclined surface 305b is inclined with respect to the top surface 301a of the substrate 301, that is, the XY plane. In a cross section perpendicular to the top surface 301a of the substrate 301, a distance between the first inclined surface 305a and the second inclined surface 305b becomes smaller in a direction away from the top surface 301a of the substrate 301.

In the example embodiment, since two or more protruding surface 305c are present, the number of each of the first inclined surfaces 305a and the second inclined surfaces 305b is also two or more. The insulating layer 305 includes the plurality of first inclined surfaces 305a and the plurality of second inclined surfaces 305b.

The insulating layer 305 further includes a flat surface 305d present around the plurality of protruding surfaces 305c. The flat surface 305d is a surface parallel to the top surface 301a of the substrate 301. Each of the plurality of protruding surfaces 305c protrudes in the Z direction from the flat surface 305d. In the example embodiment, the plurality of protruding surfaces 305c are disposed at predetermined intervals. Thus, the flat surface 305d is present between the two protruding surfaces 305c adjoining in the V direction.

The insulating layer 305 includes a plurality of protruding portions each protruding in the Z direction, and a flat portion present around the plurality of protruding portions. Each of the plurality of protruding portions extends in the direction parallel to the U direction and includes the protruding surface 305c. The plurality of protruding portions are arranged at predetermined intervals in the direction parallel to the V direction. The thickness (the dimension in the Z direction) of the flat portion is substantially constant. The insulating layer 304 has a substantially constant thickness (i.e., a dimension in the Z direction), and is formed along the bottom surface of the insulating layer 305.

The plurality of lower electrodes 61B are disposed on the plurality of first inclined surfaces 305a. The plurality of lower electrodes 61C are disposed on the plurality of second inclined surfaces 305b. As described above, since each of the first inclined surfaces 305a and the second inclined surfaces 305b is inclined with respect to the top surface 301a of the substrate 301, that is, the XY plane, each of the top surfaces of the plurality of lower electrodes 61B and each of the top surfaces of the plurality of lower electrodes 61C are also inclined with respect to the XY plane. Thus, it can be said that the plurality of first MR elements 50B and the plurality of second MR elements 50C are disposed on the inclined surfaces inclined with respect to the XY plane. The insulating layer 305 is a member for supporting each of the plurality of first MR elements 50B and the plurality of second MR elements 50C so as to allow such MR elements to be inclined with respect to the XY plane.

Note that in the example embodiment, the first inclined surfaces 305a are curved surfaces. Therefore, the first MR elements 50B are curved along the curved surfaces (the first inclined surfaces 305a). For the sake of convenience, in the present example embodiment, the magnetization directions of the magnetization pinned layers 52 of the first MR elements 50B are defined as straight directions as described above. The W1 direction and the −W1 direction that are the magnetization directions of the magnetization pinned layers 52 of the first MR elements 50B are also directions in which the tangents to the first inclined surfaces 305a at the vicinity of the first MR elements 50B extend.

Similarly, in the example embodiment, the second inclined surfaces 305b are curved surfaces. Therefore, the second MR elements 50C are curved along the curved surfaces (the second inclined surfaces 305b). For the sake of convenience, in the present example embodiment, the magnetization directions of the magnetization pinned layers 52 of the second MR elements 50C are defined as straight directions as described above. The W2 direction and the −W2 direction that are the magnetization directions of the magnetization pinned layers 52 of the second MR elements 50C are also directions in which the tangents to the second inclined surfaces 305b at the vicinity of the second MR elements 50C extend.

As shown in FIG. 5, the plurality of first MR elements 50B are disposed so that two or more MR elements 50B are arranged both in the U direction and in the V direction. The plurality of first MR elements 50B are aligned in a row on one first inclined surface 305a. Similarly, the plurality of second MR elements 50C are disposed so that two or more MR elements 50C are arranged both in the U direction and in the V direction. The plurality of second MR elements 50C are aligned in a row on one second inclined surface 305b. In the example embodiment, the row of the plurality of first MR elements 50B and the row of the plurality of second MR elements 50C are alternately arranged in the direction parallel to the V direction.

Note that one first MR element 50B and one second MR element 50C adjoining each other may or may not deviate in the direction parallel to the U direction when seen in the Z direction. Two first MR elements 50B adjoining each other across one second MR element 50C may or may not deviate in the direction parallel to the U direction when seen in the Z direction. Two second MR elements 50C adjoining each other across one first MR element 50B may or may not deviate in the direction parallel to the U direction when seen in the Z direction.

The plurality of first MR elements 50B are connected in series by the plurality of lower electrodes 61B and the plurality of upper electrodes 62B. Herein, a method for connecting the plurality of first MR elements 50B will be described in detail with reference to FIG. 7. In FIG. 7, the reference sign 61 denotes a lower electrode corresponding to a given MR element 50, and the reference numeral 62 denotes an upper electrode corresponding to the given MR element 50. As shown in FIG. 7, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown, one MR element 50 located at the end of a row of a plurality of aligned MR elements 50 is connected to another MR element 50 located at the end of another row of a plurality of MR elements 50 adjoining in a direction intersecting with the longitudinal direction of the lower electrodes 61. Such two MR elements 50 are connected to each other by a not-shown electrode. The not-shown electrode may be an electrode that connects the bottom surfaces or the top surfaces of the two MR elements 50.

In a case where the MR elements 50 shown in FIG. 7 are the first MR elements 50B, the lower electrodes 61 shown in FIG. 7 correspond to the lower electrodes 61B, and the upper electrodes 62 shown in FIG. 7 correspond to the upper electrodes 62B. In such a case, the longitudinal direction of the lower electrodes 61 is parallel to the U direction.

Similarly, the plurality of second MR elements 50C are connected in series by the plurality of lower electrodes 61C and the plurality of upper electrodes 62C. The foregoing description of the method for connecting the plurality of first MR elements 50B holds true for the method for connecting the plurality of second MR elements 50C. In a case where the MR elements 50 shown in FIG. 7 are the second MR elements 50C, the lower electrodes 61 shown in FIG. 7 correspond to the lower electrodes 61C, and the upper electrodes 62 shown in FIG. 7 correspond to the upper electrodes 62C. In such a case, the longitudinal direction of the lower electrodes 61 is parallel to the U direction.

Each of the plurality of upper coil elements 82 extends in a direction parallel to the Y direction. The plurality of upper coil elements 82 are arranged in the X direction. In particular, in the present example embodiment, when seen in the Z direction, each of the plurality of first MR elements 50B and the plurality of second MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82. In the example shown in FIGS. 5 and 6, the dimension in the X direction of each of the plurality of lower coil elements 81 is smaller than the dimension in the X direction of each of the plurality of upper coil elements 82. The distance between two lower coil elements 81 adjoining in the X direction is smaller than the distance between two upper coil elements 82 adjoining in the X direction.

In the example shown in FIGS. 5 and 6, the plurality of lower coil elements 81 and the plurality of upper coil elements 82 are electrically connected so as to constitute the coil 80 that applies a magnetic field in a direction parallel to the X direction to the free layer 54 in each of the plurality of first MR elements 50B and the plurality of second MR elements 50C. Alternatively, the coil 80 may be configured to be able to, for example, apply a magnetic field in the X direction to the free layers 54 in the first and second resistor sections R21 and R22 of the first detection circuit 20 and the first and second resistor sections R31 and R32 of the second detection circuit 30, and apply a magnetic field in the −X direction to the free layers 54 in the third and fourth resistor sections R23 and R24 of the first detection circuit 20 and the third and fourth resistor sections R33 and R34 of the second detection circuit 30. The coil 80 may be controlled by the processor 40.

Next, the first and second detection signals will be described. First, the first detection signal will be described with reference to FIG. 3. As the strength of the component of the target magnetic field in the direction parallel to the W1 direction changes, the resistance of each of the resistor sections R21 to R24 of the first detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The first detection circuit 20 generates a signal corresponding to the electric potential of the signal output port E21 as a first detection signal S21, and generates a signal corresponding to the electric potential of the signal output port E22 as a first detection signal S22.

Next, the second detection signal will be described with reference to FIG. 4. As the strength of the component of the target magnetic field in the direction parallel to the W2 direction changes, the resistance of each of the resistor sections R31 to R34 of the second detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The second detection circuit 30 generates a signal corresponding to the electric potential of the signal output port E31 as a second detection signal S31, and generates a signal corresponding to the electric potential of the signal output port E32 as a second detection signal S32.

Next, the operation of the processor 40 will be described. The processor 40 is configured to generate the first detection value and the second detection value based on the first detection signals S21 and S22 and the second detection signals S31 and S32. The first detection value is a detection value corresponding to the component of the target magnetic field in the direction parallel to the V direction. The second detection value is a detection value corresponding to the component of the target magnetic field in the direction parallel to the Z direction. The first detection value is represented by a symbol Sv, and the second detection value is represented by a symbol Sz.

The processor 40 generates the first and second detection values Sv and Sz as follows, for example. First, the processor 40 generates a value S1 by an arithmetic including obtainment of the difference S21−S22 between the first detection signal S21 and the first detection signal S22, and generates a value S2 by an arithmetic including obtainment of the difference S31−S32 between the second detection signal S31 and the second detection signal S32. Next, the processor 40 calculates values S3 and S4 using the following expressions (1) and (2).

$$S3 = (S2 + S1)/(2\cos\alpha) \qquad (1)$$

$$S4 = (S2 - S1)/(2\sin\alpha) \qquad (2)$$

The first detection value Sv may be the value S3 itself, or may be a result of a predetermined correction, such as a gain adjustment or an offset adjustment, made to the value S3. In the same manner, the second detection value Sz may be the value S4 itself, or may be a result of a predetermined correction, such as a gain adjustment or an offset adjustment, made to the value S4.

Figure 8:
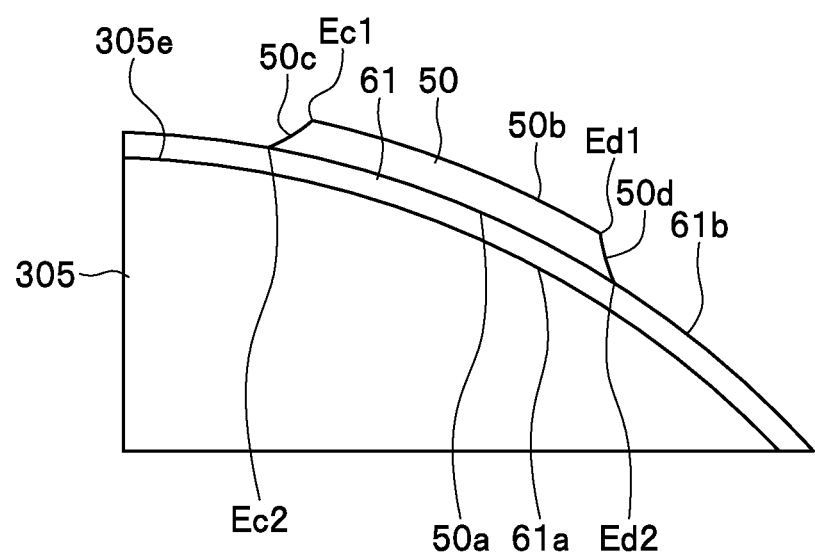
FIG. 8 is a sectional view showing a main part of the magnetic sensor according to the first example embodiment of the technology.
Figure 8:
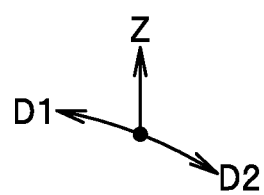

Next, features of the structure of the magnetic sensor 1 according to the example embodiment will be described. FIG. 8 is a sectional view showing a main part of the magnetic sensor 1.

FIG. 8 shows a cross section crossing the MR element 50 disposed on a given inclined surface 305e and parallel to a VZ plane. Hereinafter, a cross section parallel to the VZ plane will be referred to as a VZ cross section. The VZ cross section shown in FIG. 8 may be the one in which a cross section of the MR element 50 is seen from a position located forward in the U direction as in FIG. 6. In such a case, the MR element 50, the lower electrode 61, and the inclined surface 305e respectively correspond to the first MR element 50B, the lower electrode 61B, and the first inclined surface 305a. Alternatively, the VZ cross section shown in FIG. 8 may be the one in which a cross section of the MR element 50 is seen from a position located forward in the −U direction. In such a case, the MR element 50, the lower electrode 61, and the inclined surface 305e respectively correspond to the second MR element 50C, the lower electrode 61C, and the second inclined surface 305b.

Herein, as shown in FIG. 8, a first direction D1 and a second direction D2 that are parallel to the VZ plane are defined. The first direction D1 is a direction lying along the inclined surface 305e and is also a direction away from a reference plane. In the present example embodiment, the top surface 301a of the substrate 301 (see FIG. 6) is assumed as the reference plane. The Z direction is one direction perpendicular to the reference plane (the top surface 301a of the substrate 301). The second direction D2 is a direction lying along the inclined surface 305e and is also a direction closer to the reference plane (the top surface 301a of the substrate 301).

In the following description, a direction that lies along the inclined surface 305e and is parallel to the first direction D1 (a direction parallel to the second direction D2) will be simply referred to as a direction along the inclined surface 305e. Such a direction is also a direction that lies along the inclined surface 305e and in which a distance from the reference plane (the top surface 301a of the substrate 301) changes.

As described above, the MR element 50 has a shape anisotropy that sets the direction of the magnetization easy axis to the direction parallel to the U direction. In other words, the MR element 50 has a long shape in the direction parallel to the U direction. The VZ cross section is orthogonal to the longitudinal direction of the MR element 50. The "direction along the inclined surface 305e" defined as above is also the short-side direction of the MR element 50.

The MR element 50 includes a bottom surface 50a facing the inclined surface 305e, a top surface 50b on the side opposite to the bottom surface 50a, and a first side surface 50c and a second side surface 50d located on both sides in the short-side direction of the MR element 50 (the direction along the inclined surface 305e). The first side surface 50c is located at a position forward in the first direction D1. The second side surface 50d is located at a position forward in the second direction D2.

The first side surface 50c includes an upper end Ec1 located at an end in the direction away from the top surface 301a of the substrate 301, that is, the Z direction, and a lower end Ec2 located at an end in the direction closer to the top surface 301a of the substrate 301, that is, the −Z direction. The second side surface 50d includes an upper end Ed1 located at an end in the direction away from the top surface 301a of the substrate 301, that is, the Z direction, and a lower end Ed2 located at an end in the direction closer to the top surface 301a of the substrate 301, that is, the −Z direction.

The lower electrode 61 is provided between the MR element 50 and the inclined surface 305e. The lower electrode 61 includes a bottom surface 61a facing the inclined surface 305e, a top surface 61b on the side opposite to the bottom surface 61a, and two side surfaces connecting the bottom surface 61a and the top surface 61b (see FIG. 6). Note that the lower electrode 61 may be formed on a region from the inclined surface 305e to the flat surface 305d. In such a case, one of the two side surfaces of the lower electrode 61 is disposed on the inclined surface 305e, and the other is disposed on the flat surface 305d. Alternatively, the entire lower electrode 61 may be disposed on the inclined surface 305e. In such a case, both the two side surfaces of the lower electrode 61 are disposed on the inclined surface 305e.

Figure 9:
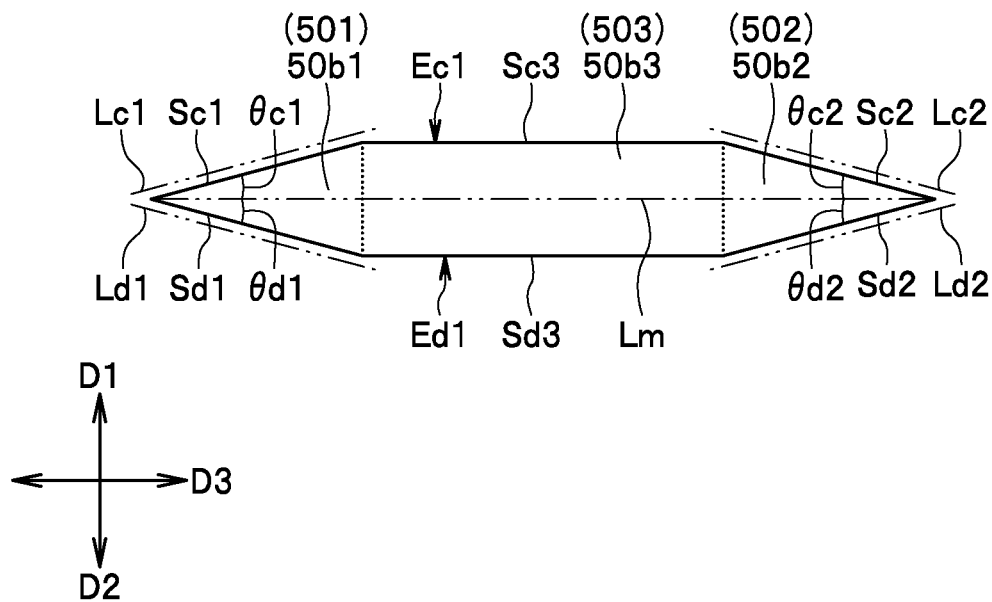
FIG. 9 is a sectional view showing a first example of a shape of a top surface of the magnetoresistive element of the first example embodiment of the technology.

Next, the shape of the MR element 50 will be described in detail. First, a first example of the top surface 50b of the MR element 50 will be described with reference to FIG. 9. FIG. 9 is a plan view showing the first example of the top surface 50b of the MR element 50. Hereinafter, the longitudinal direction of the MR element 50 (the direction parallel to the U direction) will be represented by a symbol D3.

The upper end Ec1 of the first side surface 50c includes a first portion Sc1, a second portion Sc2, and a third portion Sc3 connecting the first portion Sc and the second portion Sc2. The upper end Ed1 of the second side surface 50d includes a first portion Sd1, a second portion Sd2, and a third portion Sd3 connecting the first portion Sd1 and the second portion Sd2. The first to third portions Sc to Sc3 and the first to third portions Sd1 to Sd3 constitute the outer edge of the top surface 50b of the MR element 50.

At least a part of each of the first to third portions Sc1 to Sc3 and the first to third portions Sd1 to Sd3 is linear. Note that in the technology, the term "linear" includes both a case where the relevant portion is actually linear and a case where the relevant portion can be regarded as extending along a virtual straight line when seen in the Z direction. In particular, the first portions Sc1 and Sd1 and the second portions Sc2 and Sd2 respectively extend along virtual straight lines Lc1, Ld1, Lc2, and Ld2. Each of the virtual straight lines Lc1, Ld1, Lc2, and Ld2 is inclined with respect to each of the longitudinal direction D3 and the top surface 301a of the substrate 301. In a case where the inclined surface 305e is curved, each of the first portions Sc1 and Sd1 and the second portions Sc2 and Sd2 is also curved in a strict sense.

Edges may be respectively formed between the first portion Sc and the third portion Sc3, between the second portion Sc2 and the third portion Sc3, between the first portion Sd1 and the third portion Sd3, between the second portion Sd2 and the third portion Sd3, between the first portion Sc and the first portion Sd1, and between the second portion Sc2 and the second portion Sd2. Note that the shapes of the edges may be either pointed or rounded.

The MR element 50 includes a first non-constant portion 501, a second non-constant portion 502, and a constant portion 503 located between the first non-constant portion 501 and the second non-constant portion 502. In FIG. 9, each of a boundary between the first non-constant portion 501 and the constant portion 503 and a boundary between the second non-constant portion 502 and the constant portion 503 is indicated by a dotted line. The first non-constant portion 501, the constant portion 503, and the second non-constant portion 502 are arranged in this order in the longitudinal direction D3.

The first non-constant portion 501 includes a top surface portion 50b1 constituting a part of the top surface 50b. The second non-constant portion 502 includes a top surface portion 50b2 constituting another part of the top surface 50b. The constant portion 503 includes a top surface portion 50b3 constituting further another part of the top surface 50b.

The first portions Sc1 and Sd1 constitute the outer edge of the top surface portion 50bi of the first non-constant portion 501. Thus, in the first non-constant portion 501, at least a part of each of the upper end Ec1 of the first side surface 50c and the upper end Ed1 of the second side surface 50d is linear. In the first non-constant portion 501, a gap between the first side surface 50c and the second side surface 50d becomes smaller and a gap between the upper end Ec1 and the upper end Ed1 (a gap between the first portion Sc1 and the first portion Sd1) also becomes smaller along the longitudinal direction D3. Such gaps become smaller in a direction away from the constant portion 503.

In FIG. 9, a symbol Lm represents a virtual straight line extending between the first side surface 50c and the second side surface 50d and parallel to the longitudinal direction D3. The first portion Sc1 forms an angle θc1 with the virtual straight line Lm. The first portion Sd1 forms an angle θd1 with the virtual straight line Lm. In the first example of the top surface 50b, the angle θc1 and the angle θd1 are equal or almost equal to each other.

The sum of the angle θc1 and the angle θd1 (θc1+θd1) represents an angle formed by the first portion Sc and the first portion Sd1. The sum of the angle θc1 and the angle θd1 is preferably in the range of 5° to 40° and more preferably in the range of 10° to 25°, for example.

The second non-constant portion 502 may have a shape symmetrical to the shape of the first non-constant portion 501 about a virtual plane, which crosses the MR element 50 and also crosses the longitudinal direction D3, as the center. The second portions Sc2 and Sd2 constitute the outer edge of the top surface portion 50b2 of the second non-constant portion 502. Thus, in the second non-constant portion 502, at least a part of each of the upper end Ec1 of the first side surface 50c and the upper end Ed1 of the second side surface 50d is linear. In the second non-constant portion 502, a gap between the first side surface 50c and the second side surface 50d becomes smaller and a gap between the upper end Ec1 and the upper end Ed1 (a gap between the second portion Sc2 and the second portion Sd2) also becomes smeller along the longitudinal direction D3. Such gaps become smaller in a direction away from the constant portion 503.

The second portion Sc2 forms an angle θc2 with the virtual straight line Lm. The second portion Sd2 forms an angle θd2 with the virtual straight line Lm. In the first example of the top surface 50b, the angle θc2 and the angle θd2 are equal or almost equal to each other.

The sum of the angle θc2 and the angle θd2 (θc2+θd2) represents an angle formed by the second portion Sc2 and the second portion Sd2. A preferable range of the sum of the angle θc2 and the angle θd2 may be the same as the preferable range of the angle formed by the first portion Sc and the first portion Sd1.

In the constant portion 503, a gap between the first side surface 50c and the second side surface 50d may be constant irrespective of the position in the longitudinal direction D3. In the constant portion 503, a gap between the upper end Ec1 and the upper end Ed1 (a gap between the third portion Sc3 and the third portion Sd3) may also be constant irrespective of the position in the longitudinal direction D3.

Figure 10:
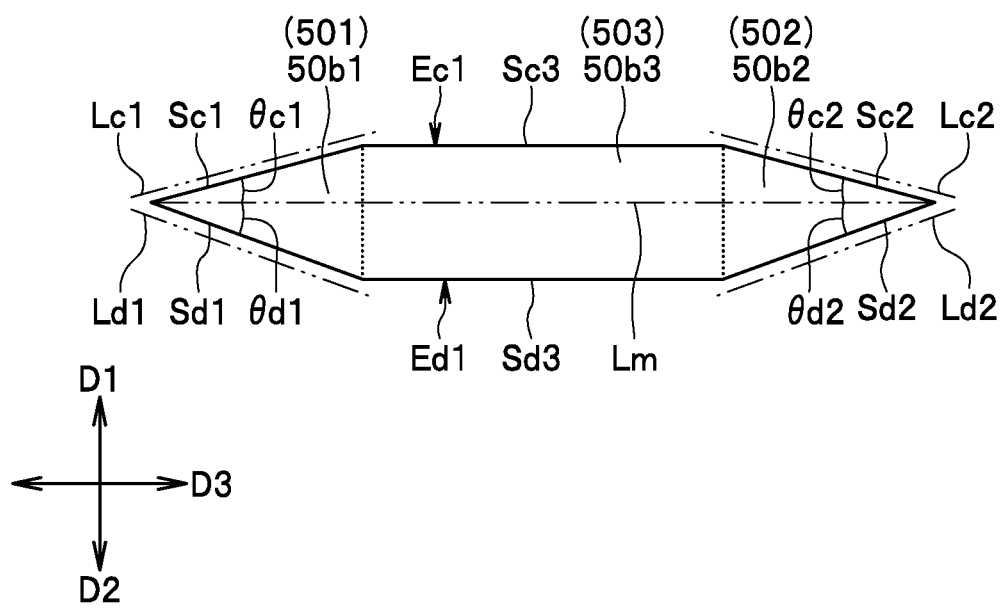
FIG. 10 is a sectional view showing a second example of a shape of a top surface of the magnetoresistive element of the first example embodiment of the technology.

Next, a second example of the top surface 50b of the MR element 50 will be described with reference to FIG. 10. FIG. 10 is a plan view showing the second example of the top surface 50b of the MR element 50.

In the second example of the top surface 50b, the relationship between the angle θc1 and the angle θd1 and the relationship between the angle θc2 and the angle θd2 differ from the corresponding relationships in the first example of the top surface 50b. In the second example of the top surface 50b, the angle θc1 and the angle θd1 are different from each other, and the angle θc2 and the angle θd2 are different from each other. In particular, in the second example of the top surface 50b, the angle θc1 is smaller than the angle θd1, and the angle θc2 is smaller than the angle θd2.

Note that each of a preferable range of the sum of the angle θc1 and the angle θd1 (an angle formed by the first portion Sc1 and the first portion Sd1) and a preferable range of the sum of the angle θc2 and the angle θd2 (an angle formed by the second portion Sc2 and the second portion Sd2) in the second example of the top surface 50b may be the same as the preferable range in the first example of the top surface 50b.

Figure 11:
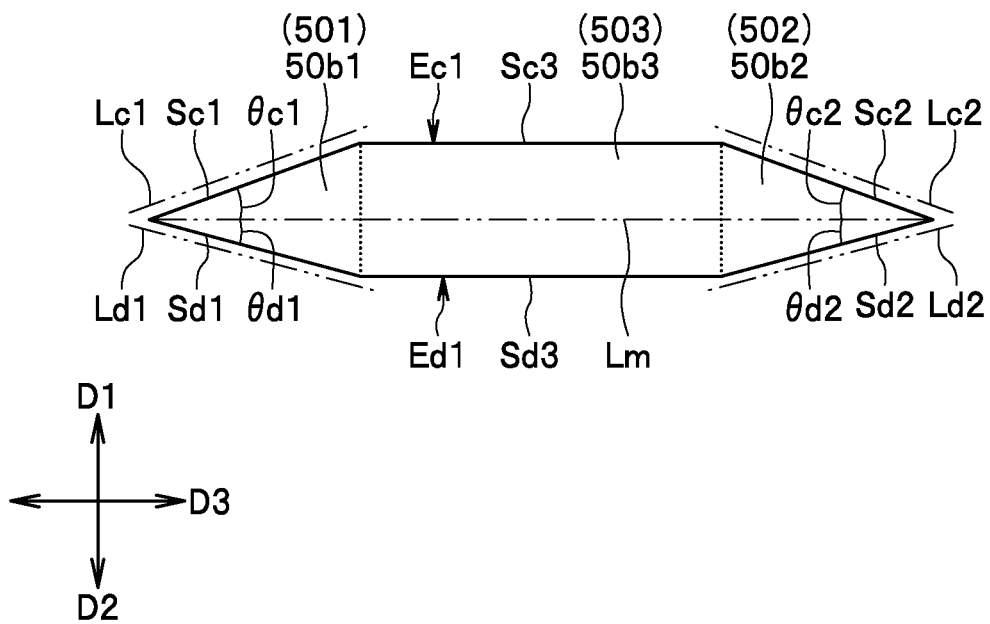
FIG. 11 is a sectional view showing a third example of a shape of a top surface of the magnetoresistive element of the first example embodiment of the technology.

Next, a third example of the top surface 50b of the MR element 50 will be described with reference to FIG. 11. FIG. 11 is a plan view showing the third example of the top surface 50b of the MR element 50.

In the third example of the top surface 50b, the relationship between the angle θc1 and the angle θd1 and the relationship between the angle θc2 and the angle θd2 differ from the corresponding relationships in the second example of the top surface 50b. In the third example, the angle θc1 is larger than the angle θd1, and the angle θc2 is larger than the angle θd2.

Note that each of a preferable range of the sum of the angle θc1 and the angle θd1 (an angle formed by the first portion Sc1 and the first portion Sd1) and a preferable range of the sum of the angle θc2 and the angle θd2 (an angle formed by the second portion Sc2 and the second portion Sd2) in the third example of the top surface 50b may be the same as the preferable range in the first example of the top surface 50b.

Figure 12:
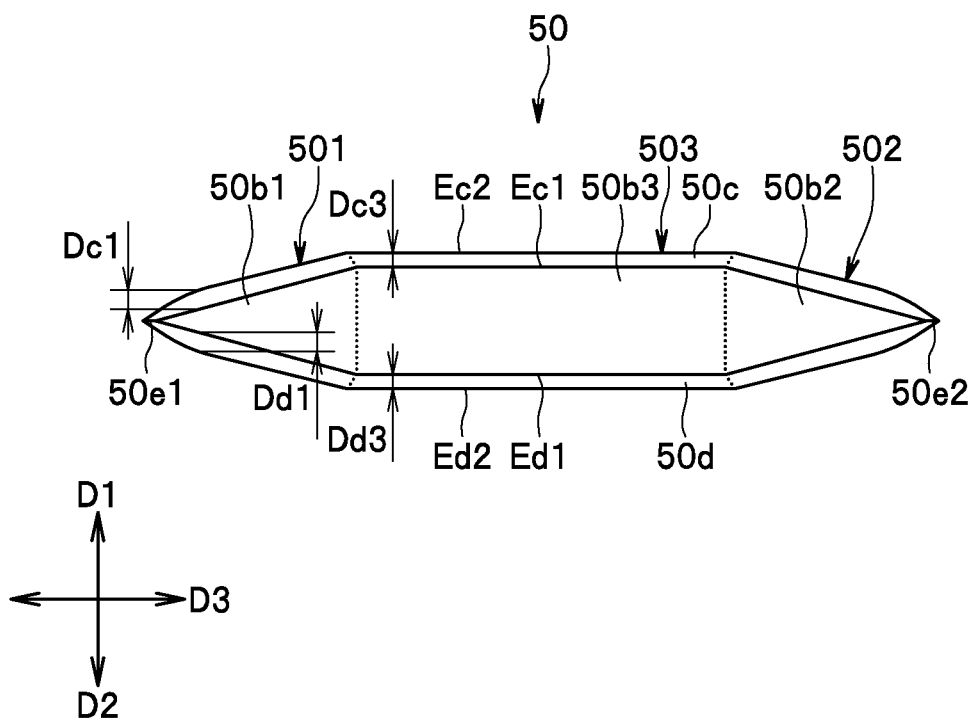
FIG. 12 is a plan view showing a first example of shapes of first and second side surfaces of the magnetoresistive element of the first example embodiment of the technology.

Next, the planar shape (i.e., the shape seen from above) of the first and second side surfaces 50c and 50d of the MR element 50 will be described in detail. First, a first example of the first and second side surfaces 50c and 50d of the MR element 50 will be described with reference to FIG. 12. FIG. 12 is a plan view showing the first example of the first and second side surfaces 50c and 50d of the MR element 50.

The first side surface 50c has a taper shape such that the first side surface 50c is inclined with respect to the inclined surface 305e (see FIG. 8). The lower end Ec2 of the first side surface 50c is located at a position forward of the upper end Ec1 of the first side surface 50c in the first direction D1. The second side surface 50d has a taper shape such that the second side surface 50d is inclined with respect to the inclined surface 305e (see FIG. 8). The lower end Ed2 of the second side surface 50d is located at a position forward of the upper end Ed1 of the second side surface 50d in the second direction D2.

The MR element 50 further includes edges 50e1 and 50e2 each formed by crossing of the first side surface 50c and the second side surface 50d. The edge 50e1 is located at an end of the MR element 50 in one direction parallel to the longitudinal direction D3. The edge 50e2 is located at an end of the MR element 50 in another direction parallel to the longitudinal direction D3.

In the first example of the first and second side surfaces 50c and 50d, the dimension of the first side surface 50c in a cross section crossing the MR element 50 and orthogonal to the longitudinal direction D3 is equal to or almost equal to the dimension of the second side surface 50d in the cross section irrespective of the position of the cross section.

In FIG. 12, a symbol Dc1 represents the dimension of the first side surface 50c in a cross section crossing the first non-constant portion 501 and orthogonal to the longitudinal direction D3. A symbol Dc3 represents the dimension of the first side surface 50c in a cross section crossing the constant portion 503 and orthogonal to the longitudinal direction D3. Each of the dimensions Dc1 and Dc3 is also the dimension of the first side surface 50c in the direction along the inclined surface 305e, and is also the dimension of the first side surface 50c in the short-side direction of the MR element 50.

In FIG. 12, a symbol Dd1 represents the dimension of the second side surface 50d in a cross section crossing the first non-constant portion 501 and orthogonal to the longitudinal direction D3. A symbol Dd3 represents the dimension of the second side surface 50d in a cross section crossing the constant portion 503 and orthogonal to the longitudinal direction D3. Each of the dimensions Dd1 and Dd3 is also the dimension of the second side surface 50d in the direction along the inclined surface 305e, and is also the dimension of the second side surface 50d in the short-side direction of the MR element 50.

The maximum value of the dimension Dc1 and the maximum value of the dimension Dd1 are equal or almost equal to each other. The maximum value of the dimension Dc3 and the maximum value of the dimension Dd3 are equal or almost equal to each other. The maximum value of the dimension Dc1 is larger than the maximum value of the dimension Dc3, and the maximum value of the dimension Dd1 is larger than the maximum value of the dimension Dd3. Thus, the sum of the maximum value of the dimension Dc1 and the maximum value of the dimension Dd1 is larger than the sum of the maximum value of the dimension Dc3 and the maximum value of the dimension Dd3.

Note that the maximum value of the dimension of the first side surface 50c in a cross section crossing the second non-constant portion 502 and orthogonal to the longitudinal direction D3 (hereinafter referred to as a first dimension) is equal to or almost equal to the maximum value of the dimension of the second side surface 50d in a cross section crossing the second non-constant portion 502 and orthogonal to the longitudinal direction D3 (hereinafter referred to as a second dimension). The maximum value of the first dimension is larger than the maximum value of the dimension Dc3, and the maximum value of the second dimension is larger than the maximum value of the dimension Dd3. Thus, the sum of the maximum value of the first dimension and the maximum value of the second dimension is larger than the sum of the maximum value of the dimension Dc3 and the maximum value of the dimension Dd3.

Figure 13:
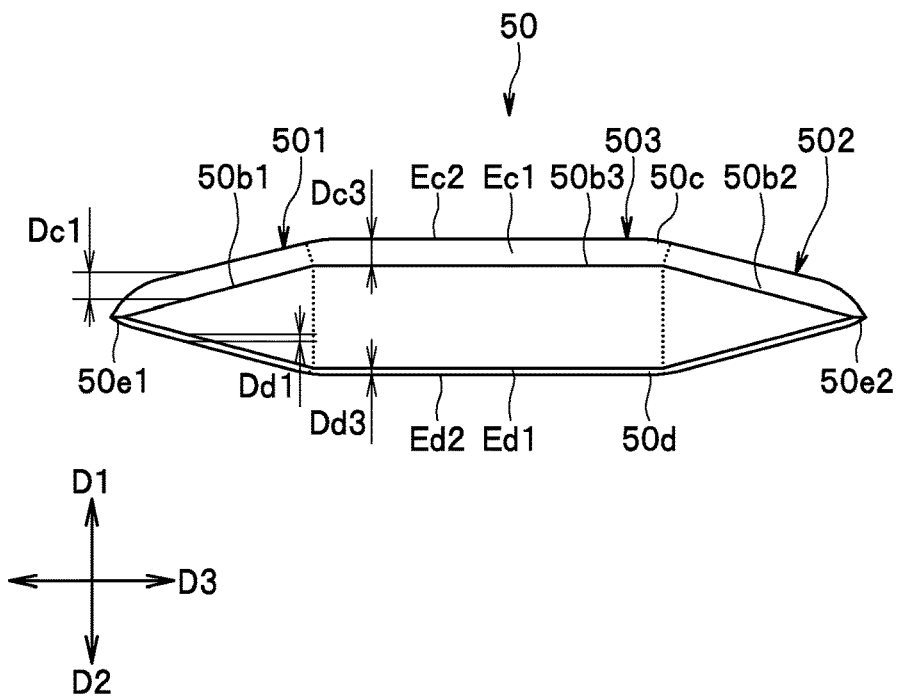
FIG. 13 is a plan view showing a second example of shapes of first and second side surfaces of the magnetoresistive element of the first example embodiment of the technology.

Next, a second example of the first and second side surfaces 50c and 50d of the MR element 50 will be described with reference to FIG. 13. FIG. 13 is a plan view showing the second example of the first and second side surfaces 50c and 50d of the MR element 50.

In the second example of the first and second side surfaces 50c and 50d, the dimension of the first side surface 50c in a cross section crossing the MR element 50 and orthogonal to the longitudinal direction D3 is different from the dimension of the second side surface 50d in the cross section. In particular, in the second example of the first and second side surfaces 50c and 50d, the dimension of the first side surface 50c in the foregoing cross section is larger than the dimension of the second side surface 50d in the foregoing cross section irrespective of the position of the foregoing cross section.

The maximum value of the dimension Dc1 is larger than the maximum value of the dimension Dd1, and the maximum value of the dimension Dc3 is larger than the maximum value of the dimension Dd3. The maximum value of the foregoing first dimension is larger than the maximum value of the foregoing second dimension.

Figure 14:
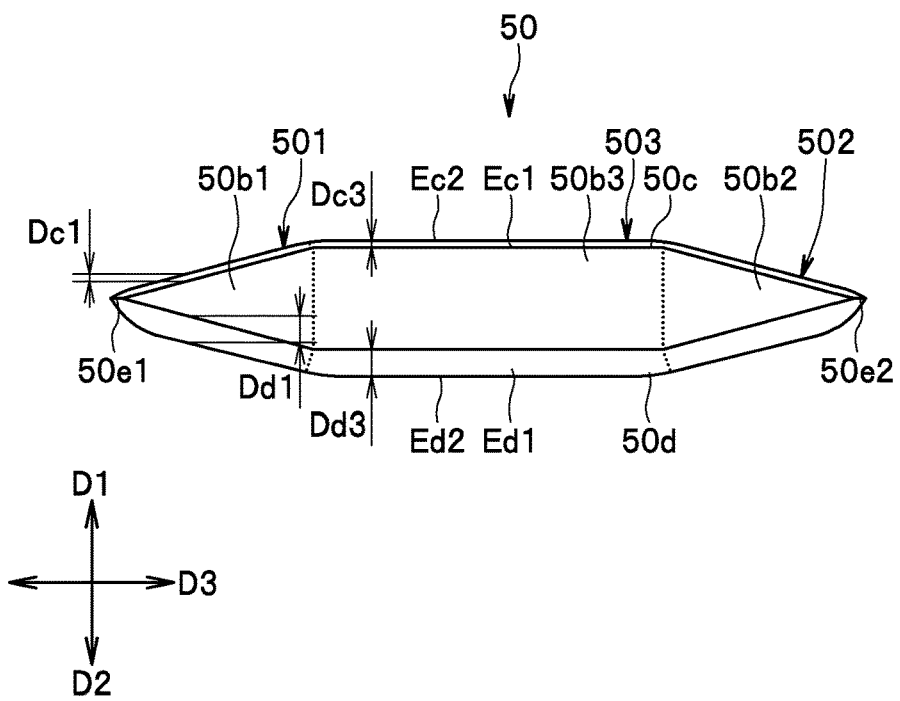
FIG. 14 is a plan view showing a third example of shapes of first and second side surfaces of the magnetoresistive element of the first example embodiment of the technology.

Next, a third example of the first and second side surfaces 50c and 50d of the MR element 50 will be described with reference to FIG. 14. FIG. 14 is a plan view showing the third example of the first and second side surfaces 50c and 50d of the MR element 50.

In the third example, the dimension of the first side surface 50c in a cross section crossing the MR element 50 and orthogonal to the longitudinal direction D3 is smaller than the dimension of the second side surface 50d in the cross section. The maximum value of the dimension Dc1 is smaller than the maximum value of the dimension Dd1, and the maximum value of the dimension Dc3 is smaller than the maximum value of the dimension Dd3. The maximum value of the foregoing first dimension is smaller than the maximum value of the foregoing second dimension.

Note that in FIGS. 12 to 14, the first example of the top surface 50b of the MR element 50 shown in FIG. 9 is combined with the first to third examples of the first and second side surfaces 50c and 50d of the MR element 50 for convenience sake. However, it is also possible to combine the second example of the top surface 50b of the MR element 50 shown in FIG. 10 or the third example of the top surface 50b of the MR element 50 shown in FIG. 11 with the first to third examples of the first and second side surfaces 50c and 50d of the MR element 50.

Next, operations and effects of the magnetic sensor 1 according to the example embodiment will be described. In the present example embodiment, the MR element 50 includes the first non-constant portion 501 and the second non-constant portion 502 each having the foregoing features. Thereby, according to the present example embodiment, it is easier to set the magnetization direction of the free layer 54 to a predetermined direction in comparison with a case where the MR element 50 does not include the first non-constant portion 501 and the second non-constant portion 502. Specifically, the strength of a magnetic field for setting the magnetization direction of the free layer 54 to a predetermined direction can be reduced. Such effects are exerted more effectively in a case where each coil element 82 overlaps at least a part of each of the first non-constant portion 501 and the second non-constant portion 502 when seen from above as shown in FIG. 5.

Second Example Embodiment

Figure 15:
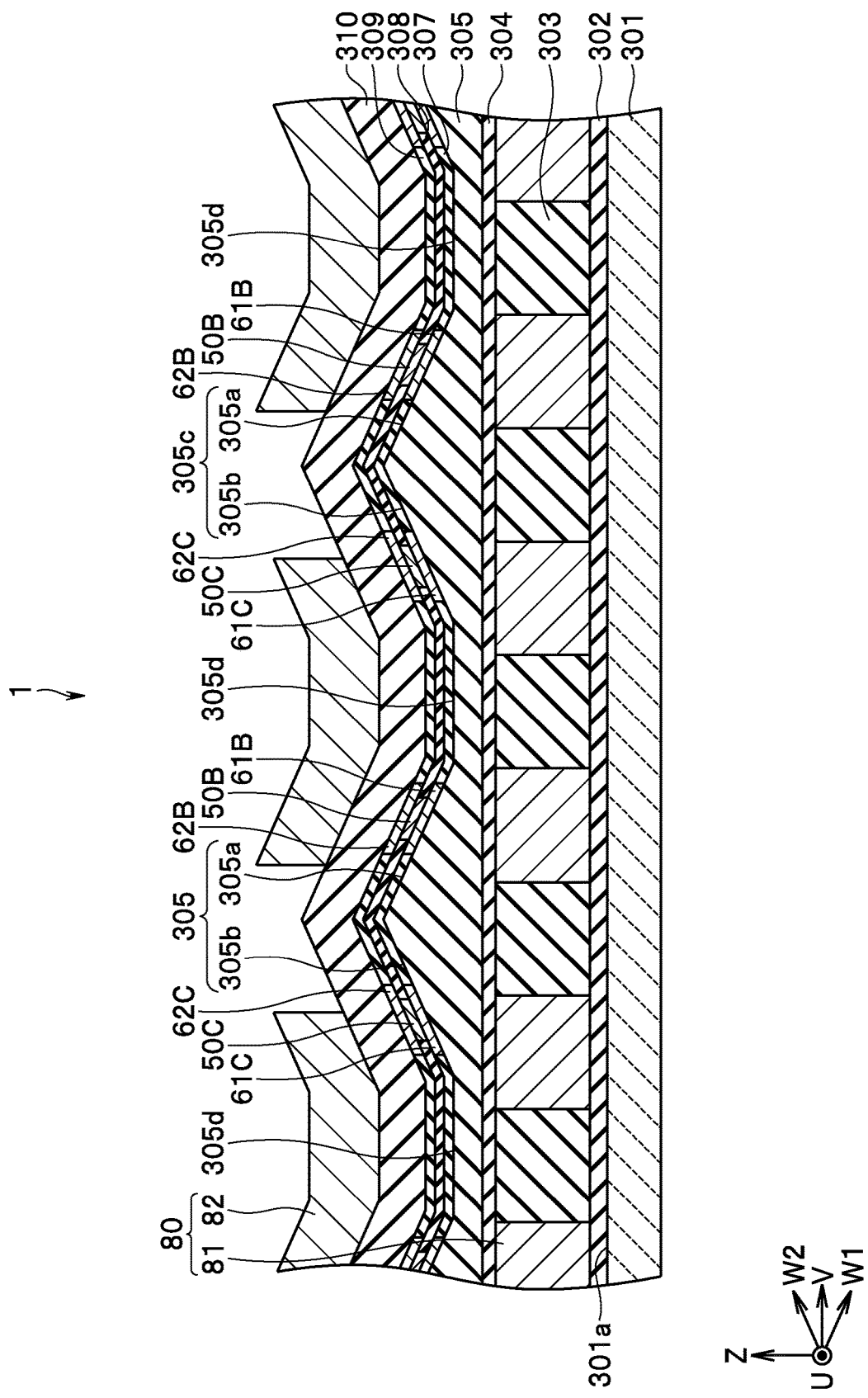
FIG. 15 is a sectional view showing a part of the magnetic sensor according to a second example embodiment of the technology.

A magnetic sensor 1 according to a second example embodiment of the technology will now be described with reference to FIG. 15. FIG. 15 is a sectional view showing a part of the magnetic sensor 1 according to the present example embodiment.

In the present example embodiment, each of the plurality of protruding surfaces 305c of the insulating layer 305 has a triangular roof-like overall shape formed by moving the triangular shape of the protruding surface 305c shown in FIG. 15 in the direction parallel to the U direction. All the plurality of first inclined surfaces 305a and the plurality of second inclined surfaces 305b of the insulating layer 305 are flat surfaces. Each of the plurality of first inclined surfaces 305a is a flat surface parallel to the U direction and the W1 direction. Each of the plurality of second inclined surfaces 305b is a flat surface parallel to the U direction and the W2 direction.

Like the example shown in FIG. 6, the insulating layer 305 may include a plurality of protrusions for forming the plurality of protruding surfaces 305c. Alternatively, the insulating layer 305 may include a plurality of slopes arranged in the direction parallel to the V direction. The plurality of slopes each include a first wall surface corresponding to a first inclined surface 305a and a second wall surface corresponding to a second inclined surface 305*b*. A protruding surface 305*c* is constituted by the first wall surface of one slope and the second wall surface of another slope adjoining on the −V direction side of the one slope.

In the example shown in FIG. 15, the plurality of slopes each have a bottom surface corresponding to the flat surface 305*d*. However, the plurality of slopes do not need to have a bottom surface each.

The configuration, operation, and effects of the present example embodiment are otherwise the same as those of the first example embodiment.

The technology is not limited to the foregoing example embodiments, and various modifications may be made thereto. For example, the shape of each of the top surface 50*b*, the first side surface 50*c*, and the second side surface 50*d* of the MR element 50 is not limited to the example shown in each example embodiment, and may be any shape as long as the requirements of the claims are met.

The magnetic sensor 1 may further include a third detection circuit configured to detect a component of the target magnetic field in a direction parallel to the XY plane, and generate at least one third detection signal having a correspondence with the component. In such a case, the processor 40 may be configured to generate a detection value corresponding to a component of the target magnetic field in the direction parallel to the U direction based on the at least one third detection signal. The third detection circuit may be integrated with the first and second detection circuits 20 and 30, or may be included in a chip separate from the first and second detection circuits 20 and 30.

As described above, the magnetic sensor according to one embodiment of the technology includes a substrate including a reference plane; a support member disposed on the substrate, the support member including an inclined surface inclined with respect to the reference plane; and a magnetic detection element disposed on the inclined surface, the magnetic detection element having a long shape in one direction. The magnetic detection element includes a first side surface and a second side surface located on both sides in a short-side direction of the magnetic detection element, each of the first side surface and the second side surface including an upper end. The first side surface is located at a position forward in a first direction, the first direction being a direction along the inclined surface and also being a direction away from the reference plane. The second side surface is located at a position forward in a second direction, the second direction being a direction along the inclined surface and also being a direction closer to the reference plane. The magnetic detection element includes a first non-constant portion in which at least a part of each of the upper end of the first side surface and the upper end of the second side surface is linear, and a gap between the upper end of the first side surface and the upper end of the second side surface becomes smaller along a longitudinal direction of the magnetic detection element.

In the magnetic sensor according to one embodiment of the technology, the magnetic detection element may further include an edge formed by crossing of the first side surface and the second side surface.

In the magnetic sensor according to one embodiment of the technology, the upper end of the first side surface of the first non-constant portion may form a first angle with a virtual straight line, the virtual straight line extending between the first side surface and the second side surface and being parallel to the longitudinal direction. The upper end of the second side surface of the first non-constant portion may form a second angle with the virtual straight line. The first angle and the second angle may be different from each other. Alternatively, the first angle and the second angle may be equal to each other.

In the magnetic sensor according to one embodiment of the technology, each of the first side surface and the second side surface may further include a lower end. The lower end of the first side surface may be located at a position forward of the upper end of the first side surface in the first direction. The lower end of the second side surface may be located at a position forward of the upper end of the second side surface in the second direction.

In the magnetic sensor according to one embodiment of the technology, the magnetic detection element may further include a constant portion in which the upper end of each of the first side surface and the second side surface is linear and a gap between the first side surface and the second side surface is constant along the longitudinal direction. An edge may be formed between the upper end of the first non-constant portion and the upper end of the constant portion. The magnetic detection element may further include a second non-constant portion that is disposed at a position where the constant portion is sandwiched between the first non-constant portion and the second non-constant portion and in which the upper end of each of the first side surface and the second side surface is linear and a gap between the first side surface and the second side surface becomes smaller along the longitudinal direction. The second non-constant portion may have a shape symmetrical to a shape of the first non-constant portion about a virtual plane as a center, the virtual plane crossing the magnetic detection element and being orthogonal to the longitudinal direction.

In a case where the magnetic detection element includes the constant portion, a maximum value of a dimension of the first side surface in a first cross section crossing the first non-constant portion and orthogonal to the longitudinal direction may be larger than a maximum value of a dimension of the first side surface in a second cross section crossing the constant portion and orthogonal to the longitudinal direction. A maximum value of a dimension of the second side surface in the first cross section may be larger than a maximum value of a dimension of the second side surface in the second cross section. A sum of a maximum value of a dimension of the first side surface in a first cross section crossing the first non-constant portion and orthogonal to the longitudinal direction and a maximum value of a dimension of the second side surface in the first cross section may be larger than a sum of a maximum value of a dimension of the first side surface in a second cross section crossing the constant portion and orthogonal to the longitudinal direction and a maximum value of a dimension of the second side surface in the second cross section.

In the magnetic sensor according to one embodiment of the technology, a first dimension and a second dimension may be equal to each other, the first dimension being a dimension of the first side surface in a third cross section crossing the magnetic detection element and orthogonal to the longitudinal direction, the second dimension being a dimension of the second side surface in the third cross section. Alternatively, a first dimension and a second dimension may be different from each other, the first dimension being a dimension of the first side surface in a third cross section crossing the magnetic detection element and orthogonal to the longitudinal direction, the second dimension being a dimension of the second side surface in the third cross section. In such a case, the first dimension may be larger than the second dimension. Alternatively, the second dimension may be larger than the first dimension.

In the magnetic sensor according to one embodiment of the technology, the magnetic detection element may include a plurality of stacked magnetic layers, and may be configured such that a current flows in a stacking direction of the plurality of magnetic layers. The plurality of magnetic layers may include a free layer and a magnetization pinned layer, the free layer having a magnetization whose direction is variable depending on an external magnetic field, the magnetization pinned layer having a magnetization whose direction is fixed, the magnetization pinned layer being provided between the free layer and the inclined surface. The magnetic sensor according to one embodiment of the technology may further include a coil configured to apply a magnetic field in a predetermined direction to the free layer. The coil may overlap at least a part of the first non-constant portion when seen in one direction perpendicular to the reference plane.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising:
   a substrate including a reference plane;
   a support member disposed on the substrate, the support member including an inclined surface inclined with respect to the reference plane; and
   a magnetic detection element disposed on the inclined surface, the magnetic detection element having a long shape in one direction, wherein:
   the magnetic detection element includes a first side surface and a second side surface located on both sides in a short-side direction of the magnetic detection element, each of the first side surface and the second side surface including an upper end;
   the first side surface is located at a position forward in a first direction, the first direction being a direction along the inclined surface and also being a direction away from the reference plane;
   the second side surface is located at a position forward in a second direction, the second direction being a direction along the inclined surface and also being a direction closer to the reference plane; and
   the magnetic detection element includes a first non-constant portion in which at least a part of each of the upper end of the first side surface and the upper end of the second side surface is linear, and a gap between the upper end of the first side surface and the upper end of the second side surface becomes smaller along a longitudinal direction of the magnetic detection element.

2. The magnetic sensor according to claim 1, wherein the magnetic detection element further includes an edge formed by crossing of the first side surface and the second side surface.

3. The magnetic sensor according to claim 1, wherein:
   the upper end of the first side surface of the first non-constant portion forms a first angle with a virtual straight line, the virtual straight line extending between the first side surface and the second side surface and being parallel to the longitudinal direction;
   the upper end of the second side surface of the first non-constant portion forms a second angle with the virtual straight line; and
   the first angle and the second angle are different from each other.

4. The magnetic sensor according to claim 1, wherein:
   the upper end of the first side surface of the first non-constant portion forms a first angle with a virtual straight line, the virtual straight line extending between the first side surface and the second side surface and being parallel to the longitudinal direction;
   the upper end of the second side surface of the first non-constant portion forms a second angle with the virtual straight line; and
   the first angle and the second angle are equal to each other.

5. The magnetic sensor according to claim 1, wherein:
   each of the first side surface and the second side surface further includes a lower end;
   the lower end of the first side surface is located at a position forward of the upper end of the first side surface in the first direction; and
   the lower end of the second side surface is located at a position forward of the upper end of the second side surface in the second direction.

6. The magnetic sensor according to claim 1, wherein the magnetic detection element further includes a constant portion in which the upper end of each of the first side surface and the second side surface is linear and a gap between the first side surface and the second side surface is constant along the longitudinal direction.

7. The magnetic sensor according to claim 6, wherein an edge is formed between the upper end of the first non-constant portion and the upper end of the constant portion.

8. The magnetic sensor according to claim 6, wherein the magnetic detection element further includes a second non-constant portion that is disposed at a position where the constant portion is sandwiched between the first non-constant portion and the second non-constant portion and in which the upper end of each of the first side surface and the second side surface is linear and a gap between the first side surface and the second side surface becomes smaller along the longitudinal direction.

9. The magnetic sensor according to claim 8, wherein the second non-constant portion has a shape symmetrical to a shape of the first non-constant portion about a virtual plane as a center, the virtual plane crossing the magnetic detection element and being orthogonal to the longitudinal direction.

10. The magnetic sensor according to claim 6, wherein:
    a maximum value of a dimension of the first side surface in a first cross section crossing the first non-constant portion and orthogonal to the longitudinal direction is larger than a maximum value of a dimension of the first side surface in a second cross section crossing the constant portion and orthogonal to the longitudinal direction; and
    a maximum value of a dimension of the second side surface in the first cross section is larger than a maximum value of a dimension of the second side surface in the second cross section.

11. The magnetic sensor according to claim 6, wherein a sum of a maximum value of a dimension of the first side surface in a first cross section crossing the first non-constant portion and orthogonal to the longitudinal direction and a maximum value of a dimension of the second side surface in the first cross section is larger than a sum of a maximum value of a dimension of the first side surface in a second cross section crossing the constant portion and orthogonal to the longitudinal direction and a maximum value of a dimension of the second side surface in the second cross section.

12. The magnetic sensor according to claim 1, wherein a first dimension and a second dimension are equal to each other, the first dimension being a dimension of the first side surface in a third cross section crossing the magnetic detection element and orthogonal to the longitudinal direction, the second dimension being a dimension of the second side surface in the third cross section.

13. The magnetic sensor according to claim 1, wherein a first dimension and a second dimension are different from each other, the first dimension being a dimension of the first side surface in a third cross section crossing the magnetic detection element and orthogonal to the longitudinal direction, the second dimension being a dimension of the second side surface in the third cross section.

14. The magnetic sensor according to claim 13, wherein the first dimension is larger than the second dimension.

15. The magnetic sensor according to claim 13, wherein the second dimension is larger than the first dimension.

16. The magnetic sensor according to claim 1, wherein the magnetic detection element includes a plurality of stacked magnetic layers, and is configured such that a current flows in a stacking direction of the plurality of magnetic layers.

17. The magnetic sensor according to claim 16, wherein the plurality of magnetic layers include a free layer and a magnetization pinned layer, the free layer having a magnetization whose direction is variable depending on an external magnetic field, the magnetization pinned layer having a magnetization whose direction is fixed, the magnetization pinned layer being provided between the free layer and the inclined surface.

18. The magnetic sensor according to claim 17, further comprising a coil configured to apply a magnetic field in a predetermined direction to the free layer.

19. The magnetic sensor according to claim 18, wherein the coil overlaps at least a part of the first non-constant portion when seen in one direction perpendicular to the reference plane.

* * * * *